United States Patent [19]
Lu et al.

[11] Patent Number: 5,913,145
[45] Date of Patent: Jun. 15, 1999

[54] METHOD FOR FABRICATING THERMALLY STABLE CONTACTS WITH A DIFFUSION BARRIER FORMED AT HIGH TEMPERATURES

[75] Inventors: Jiong-Ping Lu, Dallas; Chih-Chen Cho, Richardson, both of Tex.

[73] Assignee: Texas Instruments Incorporated, Dallas, Tex.

[21] Appl. No.: 08/920,303

[22] Filed: Aug. 28, 1997

[51] Int. Cl.⁶ .............................................. H01L 21/4763
[52] U.S. Cl. .................. 438/643; 438/648; 438/649; 438/653; 438/655; 438/656; 438/660; 438/663; 438/664; 438/680; 438/682; 438/683; 438/927
[58] Field of Search .................................. 438/643, 648, 438/649, 653, 655, 656, 660, 663, 664, 680, 682, 683, FOR 407, 927

[56] References Cited

U.S. PATENT DOCUMENTS

| | | |
|---|---|---|
| 4,816,424 | 3/1989 | Watanabe et al. ..................... 437/190 |
| 5,047,367 | 9/1991 | Wei et al. ............................... 437/200 |
| 5,567,652 | 10/1996 | Nishio ..................................... 437/200 |
| 5,710,070 | 1/1998 | Chan ........................................ 438/21 |

*Primary Examiner*—John F. Niebling
*Assistant Examiner*—David A. Zarneke
*Attorney, Agent, or Firm*—Jacqueline J. Garner; Wade James Brady; Richard L. Donaldson

[57] ABSTRACT

In order to provide a thermally stable diffusion barrier for a contact, a layer of titanium is formed on the patterned substrate. A layer of tungsten nitride is formed on the titanium layer. After an annealing step, an interfacial layer and a layer of titanium nitride are formed between the substrate and a tungsten layer. These layers provide a diffusion barrier which is more thermally stable than a titanium nitride layer applied directly on the substrate and permits the formation of a contact structures that can withstand subsequent high temperature steps.

13 Claims, 1 Drawing Sheet

METHOD FOR FABRICATING THERMALLY STABLE CONTACTS WITH A DIFFUSION BARRIER FORMED AT HIGH TEMPERATURES

BACKGROUND OF THE INVENTION

1. Field of the Invention

This invention relates generally to the fabrication of semiconductor devices and, more particularly, to an improved contact structure for semiconductor devices which can withstand the high-temperature processes necessary at later stages of device fabrication flow.

2. Description of the Related Art

As the density of integrated devices in dynamic random access memory (DRAM) devices has increased, the size of the contact hole has decreased while the aspect ratio of the contact hole has increased. As a result, the fabrication of contact structures for sub-micron complementary metal oxide semiconductor (CMOS) devices is difficult. Typically, a contact structure is formed after the formation of the capacitor elements. However, if the contact structure can be formed before the formation of the capacitor structure and withstand the high temperature steps required in the formation of the capacitor structure(s), the process flow can be simplified and a reduced aspect ratio for the contact hole(s) can be obtained. In the prior art, a TiN diffusion barrier between the tungsten conducting layer and the substrate is formed by sputtering titanium in an ambient environment which includes nitrogen or by chemical vapor deposition. The Ti/TiN materials can not withstand a high temperature cycle at temperatures required for the formation of a capacitor structure.

A need has been felt for a technique for forming a contact with a diffusion barrier which is easy to fabricate and which has sufficient thermal stability to withstand the process temperature required in the formation of contact structures.

SUMMARY OF THE INVENTION

The aforementioned and other aspects of the present invention are accomplished, according to the present invention, by first forming, after the contact patterns are fabricated, a titanium layer. The titanium layer can be formed, for example, by a chemical vapor deposition or a physical vapor deposition process. A tungsten nitride ($WN_x$) is deposited on the titanium layer. The tungsten nitride layer can be formed by thermal, photo- or plasma-enhanced chemical vapor deposition, or by sputtering a tungsten target in an ambient atmosphere containing nitrogen. During a high temperature annealing step, the tungsten nitride layer reacts with the titanium layer. The nitrogen in the tungsten nitride layer can transfer to the titanium layer to form titanium nitride ($TiN_x$) layer. The resulting titanium nitride layer provides a more stable (at high temperature) diffusion barrier than the conventional deposited titanium nitride layer.

These and other features of the present invention will be understood upon the reading of the following description in conjunction with the Figures.

DESCRIPTION OF THE PREFERRED EMBODIMENT(S)

1. Detailed Description of the Drawings

Figure 1A:
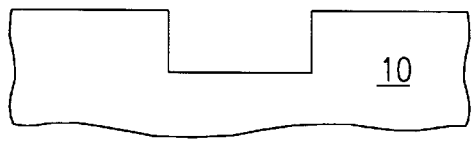
FIG. 1A through FIG. 1E illustrate the steps to provide a temperature-stable contact diffusion barrier according to a first implementation of the present invention.
Figure 1B:
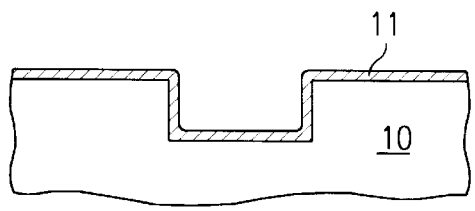
Figure 1C:
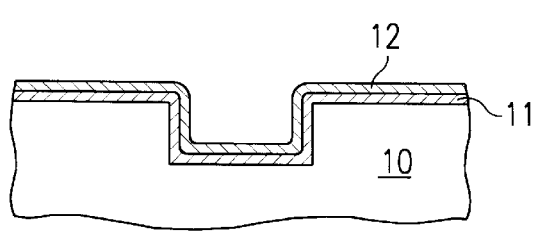
Figure 1D:
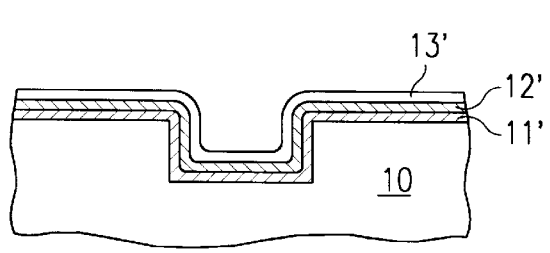
Figure 1E:
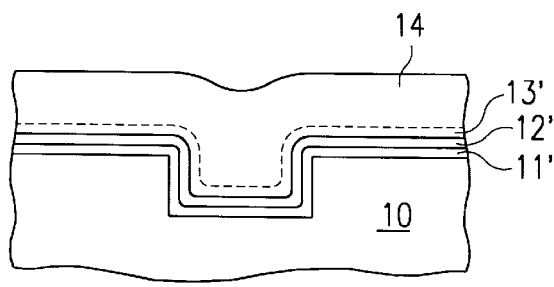
Figure 2E:
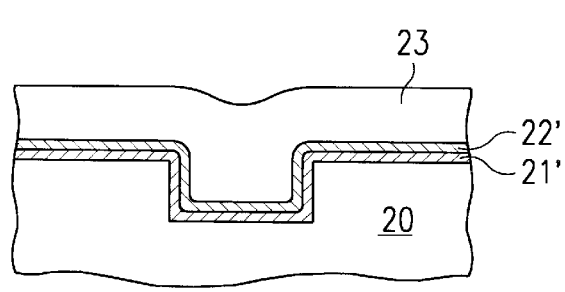

Referring to FIG. 1A through FIG. 1E, a first procedure for providing a thermally stable contact structure according to the first embodiment of the present invention. In FIG. 1A, a substrate 10 has been patterned. In Fig. 1B, a layer of titanium 11 is formed on substrate 10. In FIG. 1C, a layer of tungsten nitride ($WN_x$) 12 is formed on the titanium layer 11. The substrate 10 and layers (11 and 12) formed thereon are then annealed. As a result of the annealing process, titanium layer 11 reacts with the underlying substrate to form an interfacial layer 11', the tungsten nitride layer 12 is converted to titanium nitride ($TiN_y$) layer 12', and a tungsten layer 13' is formed on layer 12'. In FIG. 1E, an additional layer of tungsten 14 can be formed on tungsten layer 13.

Figure 2A:
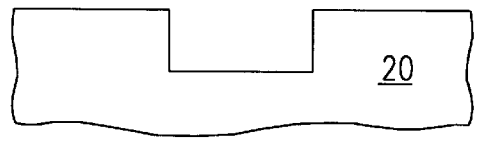
FIG. 2A through FIG. 2E illustrate the process to provide a temperature-stable contact diffusion barrier according to a second implementation of the present invention.
Figure 2B:
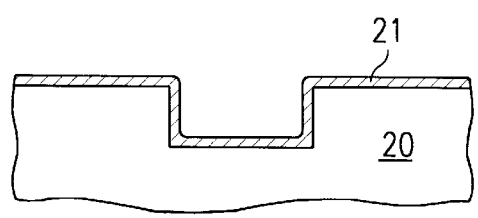
Figure 2C:
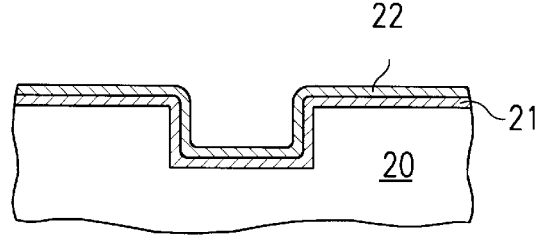
Figure 2D:
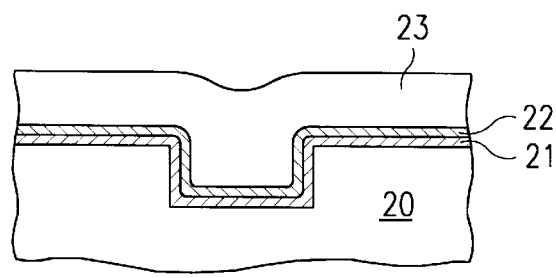

Referring to FIG. 2A through FIG. 2E, a second process for forming a thermally stable diffusion barrier is illustrated. In FIG. 2A, a substrate 20 is patterned. In FIG. 2B, a titanium layer 21 is formed on the substrate. In FIG. 2C, a tungsten nitride ($WN_p$) layer 22 is formed on titanium layer 21. And a tungsten layer 23 is formed on the tungsten nitride layer 22. The substrate 20 and the layers (21, 22, 23) formed thereon are annealed. As a result of this annealing process, titanium layer 21 is converted to a titanium silicon ($TiSi_q$) layer 21', tungsten nitride ($WN_p$) layer 22 reacts with the underlying titanium to form titanium nitride ($TiN_r$) layer 22', and a tungsten layer 23 remains.

In the fabrication processes described above, the titanium deposition steps can be performed using chemical vapor deposition processes or physical vapor deposition processes. The preferable chemical vapor deposition process for the titanium deposition is based on the following chemical process $$TiX_4 + H_2 \rightarrow Ti + HX,$$

where X=Cl, Br, or I. If the physical vapor deposition process is used, the preferred method is an ionized metal deposition (IMP), the IMP process having better step coverage than conventional sputtering methods. For tungsten nitride deposition, the preferred process is the chemical vapor deposition based on the following chemical processes:

$WF_6 + NH_3 + H_2 \rightarrow WN_x + HF$ (thermal, plasma, or photo-enhanced)

$WF_6 + N_2 + H_2 \rightarrow WN_x + HF$ (plasma or photo-enhanced)

$W(CO)_6 + NH_3 \rightarrow WN_x + CO + H_2$ (thermal or photo-enhanced)

2. Operation of the Preferred Embodiment(s)

Tests using the x-ray diffraction (XRD) technique or the Rutherford backscattering spectrometry (RBS) technique have demonstrated the thermal stability of the multi-layer structures resulting from the processes described with respect to FIGS. 1A–1E and FIGS. 2A–2E. For W/TiN/Ti/Si control samples fabricated using the usual techniques, $WSi_s$ formation can be detected using the XRD technique and the RBS technique after annealing for 10 minutes at 850° C. In contradistinction, the processes disclosed herein provide no evidence of an interaction between the tungsten and the silicon substrate.

The techniques of the present invention can be implemented in a slightly different form. By way of specific example, the titanium layer can be replaced by $TiSi_m$ or $TiSi_n/Ti$ layers. In addition, the titanium and the titanium silicide layers can be replaced by cobalt, nickel and/or the corresponding metal silicides.

While the invention has been described with particular reference to the preferred embodiment, it will be understood by those skilled in the art that various changes may be made and equivalents substituted for elements of the preferred embodiment without departing from the invention. In addition, many modifications may be made to adapt a particular situation and material to a teaching of the present invention without departing from the essential teachings of the present invention.

As is evident from the foregoing discussion, certain aspects of the invention are not limited to the particular details of the examples illustrated, and it is therefore contemplated that other modifications and applications will occur to those skilled in the art. It is accordingly intended that the claims shall cover all modifications and applications as do not depart from the spirit and scope of the invention.

What is claimed is:

1. A method of forming a diffusion barrier layer for a contact structure, said method comprising the steps of:

forming a layer of titanium on a patterned substrate;

forming a layer of tungsten nitride on said titanium layer;

annealing said layers along with said substrate to form a titanium nitride layer and a tungsten layer.

2. The method of claim 1 wherein titanium is replaced by an element selected from the group consisting of cobalt and nickel.

3. The method of claim 1 wherein said titanium layer is replaced by an $MSi_x$ layer or $MSi_x/M$ layers, wherein M is a metal selected from the group consisting of titanium, cobalt and nickel.

4. The method of claim 1 wherein said titanium layer is formed using a CVD process based on the chemical process $$TiX_4 + H_2 \rightarrow Ti + HX,$$

where X is selected from the group consisting of chlorine, bromine and iodine.

5. The method of claim 1 wherein said tungsten nitride layer is formed using CVD process based on a chemical process selected from the group of chemical processes consisting of:

$$WF_6 + NH_3 + H_2 \rightarrow WN_x + HF,$$

$$WF_6 + N_2 + H_2 \rightarrow WN_x + HF, \text{ and}$$

$$W(CO)_6 + NH_3 \rightarrow WN_x + CO + H_2.$$

6. The method of claim 1 wherein said titanium and/or said tungsten nitride layer are prepared by physical vapor deposition.

7. The method of claim 1 wherein an additional tungsten layer is added after said annealing step.

8. A method for forming a contract structure, said method comprising the steps of:

forming a titanium layer on a substrate;

forming a tungsten nitride layer on said titanium layer, forming a tungsten layer on said tungsten nitride layer; and annealing the structure resulting from a formation of these layers to form a titanium nitride layer and a tungsten layer.

9. The method of claim 8 wherein titanium is replaced by an element selected from the group consisting of cobalt and nickel.

10. The method of claim 8 wherein said titanium layer is replaced by one of an $MSi_x$ layer or a $MSi_x/M$ layers, where M is selected from the group consisting of titanium, cobalt, or nickel.

11. The method of claim 8 wherein said titanium layer is formed using a CVD process based on the chemical process $$TiX_4 + H_2 \rightarrow Ti + HX,$$

wherein X is selected from the group consisting of chlorine (Cl), bromine (Br), and iodine (I).

12. The method of claim 8 wherein said tungsten nitride layer is formed using CVD process based on a chemical process selected from the group of chemical processes consisting of:

$$WF_6 + NH_3 + H_2 \rightarrow WN_x + HF,$$

$$WF_6 + N_2 + H_2 \rightarrow WN_x + HF, \text{ and}$$

$$W(CO)_6 + NH_3 \rightarrow WN_x + CO + H_2.$$

13. The method of claim 8 wherein said titanium and/or said tungsten nitride layers are prepared by physical vapor deposition.

* * * * *